(12) United States Patent
Uchiyama

(10) Patent No.: US 6,767,763 B1
(45) Date of Patent: Jul. 27, 2004

(54) COMPONENT MOUNTING METHOD AND METHOD OF PRODUCING ELECTRO-OPTICAL DEVICE

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 125 days.

(21) Appl. No.: 09/699,294

(22) Filed: Oct. 27, 2000

(30) Foreign Application Priority Data

Nov. 4, 1999 (JP) ............................................ 11-313867

(51) Int. Cl.[7] .......................... H01L 21/44; H01L 21/48; H01L 21/50
(52) U.S. Cl. ....................... 438/116; 438/119; 438/108; 156/322; 29/832
(58) Field of Search ................................ 438/116, 119, 438/108; 156/299, 322; 29/832

(56) References Cited

U.S. PATENT DOCUMENTS

| | | | | |
|---|---|---|---|---|
| 4,749,120 A | * | 6/1988 | Hatada | 228/123 |
| 5,084,961 A | * | 2/1992 | Yoshikawa | 29/840 |
| 5,428,190 A | * | 6/1995 | Stopperan | 174/261 |
| 5,502,889 A | * | 4/1996 | Casson et al. | 29/830 |
| 5,727,310 A | * | 3/1998 | Casson et al. | 29/830 |
| 6,077,382 A | * | 6/2000 | Watanabe | 156/322 |
| 6,198,522 B1 | * | 3/2001 | Yanagi | 349/152 |
| 6,462,284 B1 | * | 10/2002 | Hashimoto | 174/260 |

FOREIGN PATENT DOCUMENTS

| | | | |
|---|---|---|---|
| JP | 08-106102 | | 4/1996 |
| JP | 2000-187234 A | * | 7/2000 |

OTHER PUBLICATIONS

Patent Abstracts of Japan for Publication No. 08–106102.

* cited by examiner

Primary Examiner—Olik Chaudhuri
Assistant Examiner—Fernando Toledo
(74) Attorney, Agent, or Firm—Harness, Dickey & Pierce, P.L.C.

(57) ABSTRACT

A method of mounting a component in which a component is thermally press-bonded onto a substrate with a conductive adhesive. The method includes a substrate heating step in which the substrate is heated to a temperature which is 20° C.~40° C. below the glass transition point of a bonding resin contained in the conductive adhesive, and a thermal press-bonding step in which the component is thermally press-bonded onto the substrate heated to the aforementioned temperature with the conductive adhesive.

17 Claims, 6 Drawing Sheets

[FIG. 1]
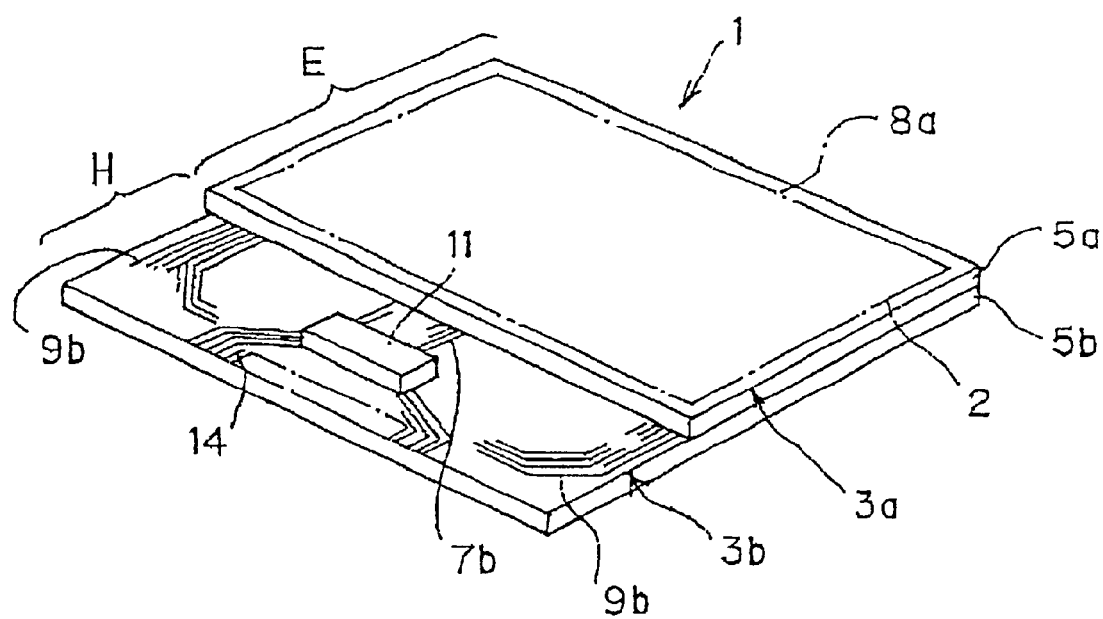

[FIG. 2]
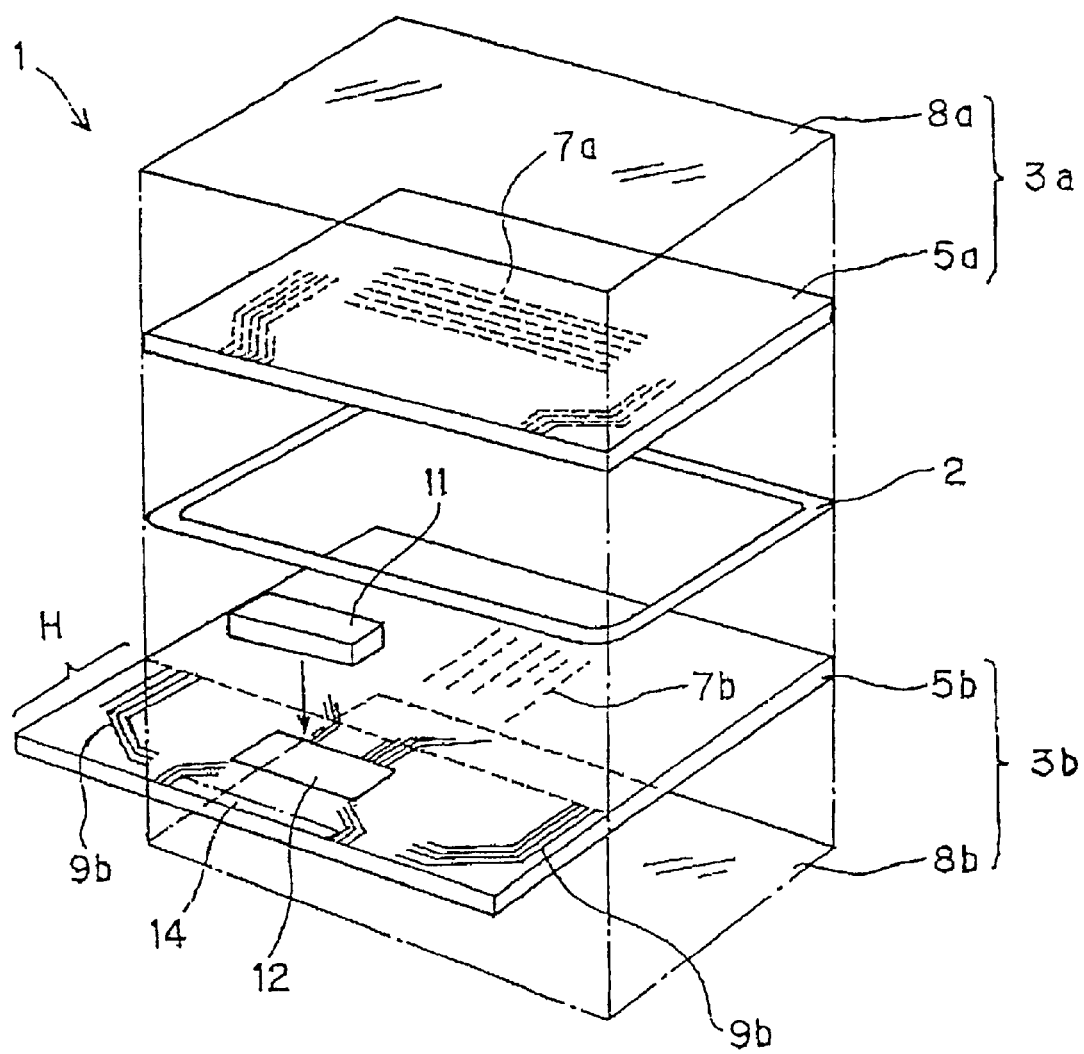

[FIG. 3]
(a)
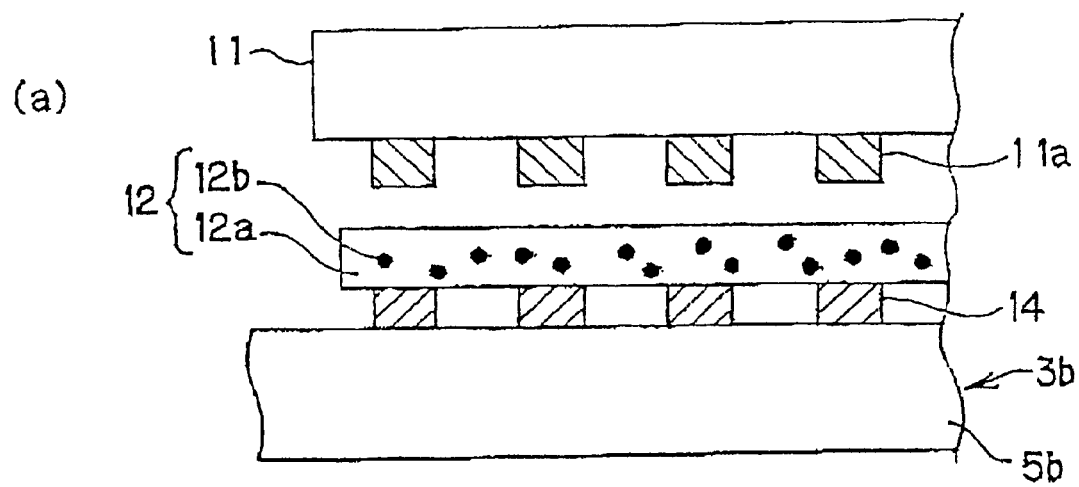
(b)
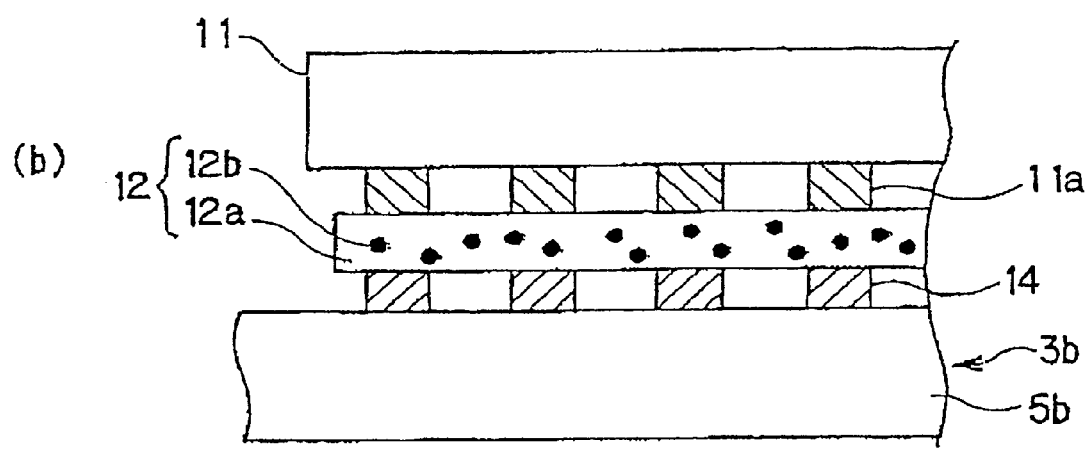

[FIG. 4]
(a)
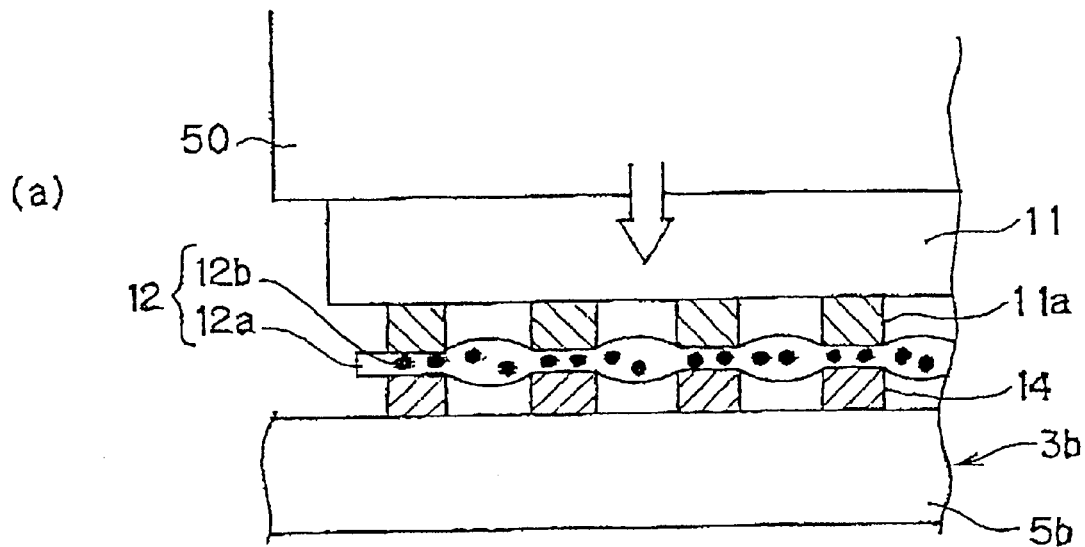
(b)
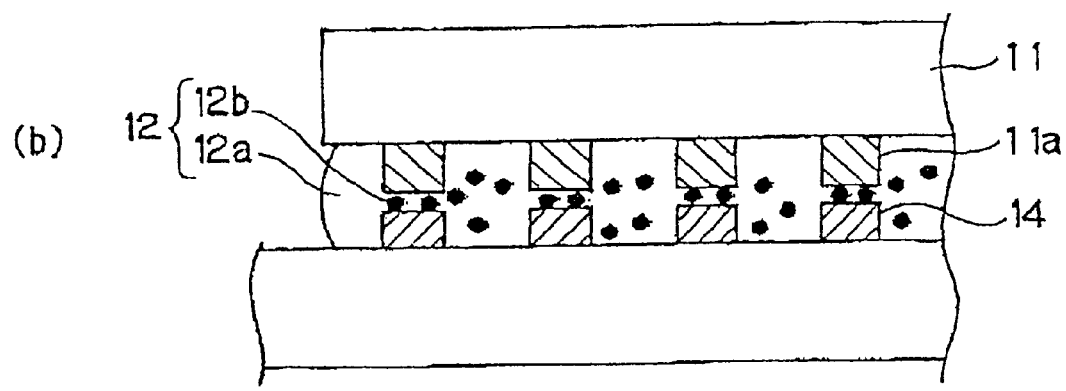

[FIG. 5]
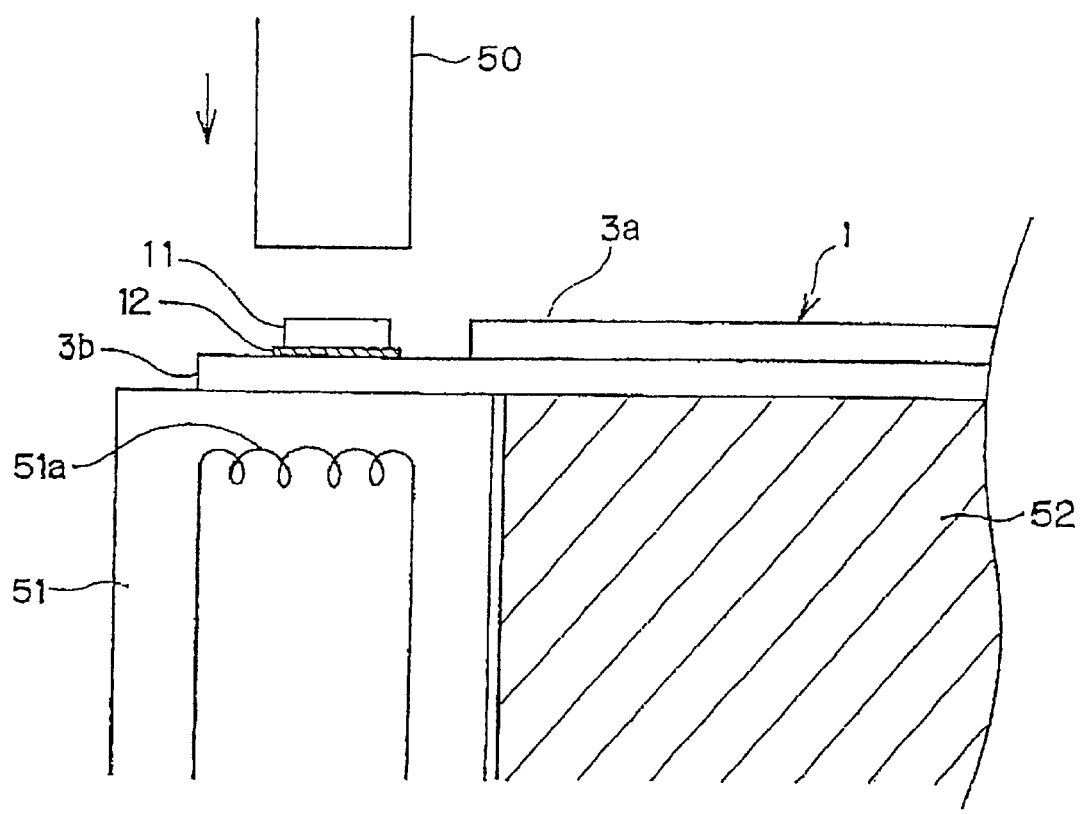

[FIG. 6]
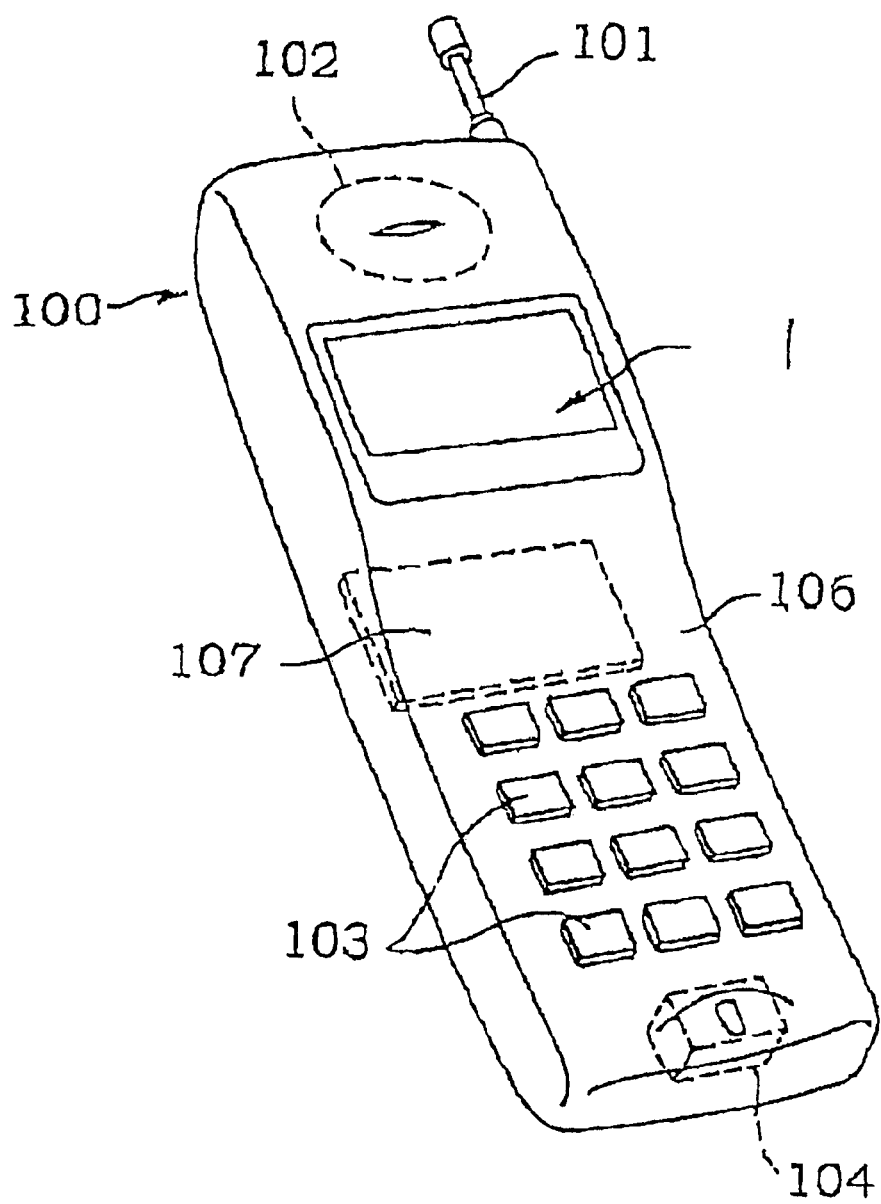

COMPONENT MOUNTING METHOD AND METHOD OF PRODUCING ELECTRO-OPTICAL DEVICE

BACKGROUND OF THE INVENTION

1. Industrial Field of the Invention

The present invention relates to a method of mounting a component in which the component, such as a semiconductor chip, is thermally press-bonded onto a substrate with a conductive adhesive, such as anisotropic conductive adhesive. The present invention also relates to a method of producing an electro-optical device.

2. Description of the Related Art

A technology for mounting a component, such as a semiconductor chip, onto a glass substrate of, for example, a liquid crystal panel by a thermal press-bonding operation using anisotropic conductive film (ACF) is known. In this technology, by applying heat and pressure to the component while the anisotropic conductive film is sandwiched between the substrate and the component, resin contained in the anisotropic conductive film is set in order to bond the component to the substrate. Here, using the conductive particles contained in the anisotropic conductive film, a terminal on the substrate and a terminal of the component are electrically connected together.

However, in the mounting process using anisotropic conductive film, since the component is heated during the thermal press-bonding operation, the residual stress remaining after cooling, that is, after mounting the component onto the substrate may result in less reliable mounting. In addition, in order to electrically connect the terminal on the substrate and the terminal of the component with high reliability, it is necessary to sandwich a sufficient number of conductive particles between the terminals. In order to achieve this, it is necessary to properly control the flow of the anisotropic conductive film which is melted during the thermal press-bonding operation.

Accordingly, it is an object of the present invention to provide a component mounting method which makes it possible to more reliably mount a component using a conductive adhesive such as an anisotropic conductive film. It is also an object of the present invention to provide a method of producing an electro-optical device.

SUMMARY OF THE INVENTION

According to a first aspect of the present invention, there is provided a method of mounting a component in which the component is thermally press-bonded onto a substrate with a conductive adhesive. The method comprises the steps of: heating the substrate to a temperature which is 20° C.~40° C. below the glass transition point of a bonding resin contained in the conductive adhesive; and thermally press-bonding the component with the conductive adhesive onto the substrate heated to the aforementioned temperature.

According to this method of mounting a component, after the substrate has been heated to a temperature which is 20° C. 40° C. below the glass transition point of the bonding resin contained in the conductive adhesive, the component is thermally press-bonded onto the substrate with the conductive adhesive, so that the difference between the temperature of the component and that of the substrate when the component is thermally press-bonded during the press-bonding step can be decreased. Therefore, residual stress remaining after the mounting of the component can be decreased. In addition, since, in the thermal press-bonding operation, the substrate is heated, causing the temperature of the conductive adhesive to increase, the viscosity of the conductive adhesive during the thermal press-bonding step is sufficiently decreased, so that the conductive adhesive flows quickly. Consequently, the conductive particles contained in the conductive adhesive tend to remain between the terminal of the component and the terminal on the substrate, making it possible to more reliably electrically connect both of the terminals.

According to another aspect of the present invention, there is provided a method of mounting a component in which the component is thermally press-bonded onto a substrate with a conductive adhesive. The method comprising the steps of temporarily press-bonding the component onto the substrate with the conductive adhesive; heating the substrate to a temperature which is 20° C.~40° C. below the glass transition point of a bonding resin contained in the conductive adhesive while the component is temporarily press-bonded onto the substrate; and thermally press-bonding the component with the conductive adhesive onto the substrate heated to the aforementioned temperature.

According to this method of mounting a component, after the substrate has been heated to a temperature which is 20° C. to 40° C. below the glass transition point of the bonding resin contained in the conductive adhesive, the component is thermally press-bonded onto the substrate with the conductive adhesive, so that the difference between the temperature of the component and that of the substrate when the component is thermally press-bonded during the press-bonding step can be decreased. Therefore, residual stress remaining after the mounting of the component can be decreased. In addition, since, in the thermal press-bonding operation, the substrate is heated, causing the temperature of the conductive adhesive to increase, the viscosity of the conductive adhesive during the thermal press-bonding step is sufficiently decreased, so that the conductive adhesive flows quickly. Consequently, the conductive particles contained in the conductive adhesive tend to remain between the terminal of the component and the terminal on the substrate, making it possible to more reliably electrically connect both of the terminals.

The step of heating the substrate may comprise heating the substrate to a temperature which is 25° C.~35° C. below the glass transition point of the conductive adhesive.

The step of heating the substrate may comprise heating the substrate to the aforementioned temperature by heating a receiving table on which the substrate is placed.

The conductive adhesive may contain thermosetting resin and conductive particles mixed in the thermosetting resin.

A semiconductor chip used as the component may be mounted on a glass substrate used as the substrate.

The glass substrate may form a liquid crystal device.

The glass transition point of the conductive adhesive may lie in a range of from 80° C. to 130° C.

According to still another aspect of the present invention, there is provided a method of producing an electro-optical device having a pair of opposing substrates. The method comprises the step of mounting a semiconductor chip onto at least one of the substrates with an anisotropic conductive film. The step of mounting a semiconductor chip comprises the steps of heating one of the substrates to a temperature which is 20° C. to 40° C. below the glass transition point of a bonding resin contained in the anisotropic conductive film; and thermally press-bonding the semiconductor chip with the anisotropic conductive film onto the substrate heated to the aforementioned temperature.

For the sake of easier understanding of the present invention, brackets are added to reference numerals and characters in the attached drawings. However, the present invention is not limited to the forms of the component parts illustrated in the figures.

BRIEF DESCRIPTION OF THE DRAWINGS

FIG. 1 is a perspective view of a liquid crystal device to which a method of mounting a component in accordance with the present invention is applied.

FIG. 2 is an exploded perspective view of the liquid crystal device shown in FIG. 1.

FIGS. 3(a) and 3(b) are sectional views illustrating steps of mounting a liquid crystal driving IC. FIG. 3(a) illustrates a state in which an ACF has been applied, whereas FIG. 3(b) illustrates a state in which the liquid crystal driving IC has been temporarily press-bonded.

FIGS. 4(a) and 4(b) are sectional views illustrating steps of mounting the liquid crystal driving IC. FIG. 4(a) illustrates a state in which the liquid crystal driving IC is thermally press-bonded by a thermal press-bonding head, whereas FIG. 4(b) illustrates a state after the liquid crystal driving IC has been press-bonded.

FIG. 5 illustrates a component producing device used in the step of mounting the liquid crystal driving IC.

FIG. 6 is a perspective view of a portable telephone which includes the liquid crystal device shown in FIGS. 1 and 2.

DETAILED DESCRIPTION OF THE PREFERRED EMBODIMENTS

Referring to FIGS. 1 to 5, a description of an embodiment of a component mounting method in accordance with the present invention will be given, with the component mounting method being applied to a process of producing an electro-optical device using as an electro-optical material liquid crystal based on the COG (chip on Glass) method.

FIG. 1 is a perspective view of an embodiment of a liquid crystal device. FIG. 2 is an exploded perspective view of the liquid crystal device.

A liquid crystal device 1 includes a pair of substrates 3a and 3b whose peripheral portions are bonded together by a sealant 2. The sealant 2 is formed using a printing technology such as a screen printing technology. The substrates 3a and 3b are produced by forming various elements onto substrate materials 5a and 5b formed of materials such as glass or flexible film materials such as plastic.

The size of a gap, or what is called a cell gap, formed between the substrates 3a and 3b is limited to a uniform value of, for example, approximately 5 μm by a plurality of spacers. Liquid crystal is sealed in an area in the cell gap surrounded by the sealant 2.

A plurality of electrodes 7a are formed on the liquid-crystal-side surface (that is, the surface opposing the substrate 3b) so as to be parallel to each other. Similarly, a plurality of electrodes 7b are formed on the liquid-crystal-side surface (that is, the surface opposing the substrate 3a) so as to be parallel to each other. The electrodes 7a formed on the substrate 3a, and the electrodes 7b formed on the substrate 3b are disposed so as to intersect each other at right angles to each other. A plurality of points where these electrodes intersect in a dot-matrix-like fashion form pixels for displaying an image. Polarizers 8a and 8b are stuck onto outer surfaces of the substrates 3a and 3b, respectively.

The substrate 3b includes a liquid crystal area portion E in which liquid crystal is sealed, and a protruding portion H which protrudes outwardly from the liquid crystal area portion E. In other words, the substrate 3b protrudes from an edge of the substrate 3a, and the electrodes 7b formed on the substrate 3b extend into the protruding portion H so as to be formed as wirings. The electrodes 7a formed on the substrate 3a are designed so as to be electrically conductive with electrodes 9b formed on the substrate 3b through a conductive material (not shown) which is scattered inside the sealant 2. The electrodes 9b extend into the protruding portion H so as to be formed as wirings.

As shown in FIG. 2, a rectangular mounting area to which a liquid crystal driving IC 11 is mounted is provided in the protruding portion H. The liquid crystal driving IC 11 is mounted to the mounting area by bonding it thereto with ACF (anisotropic conductive film) 12. As shown in FIGS. 1 and 2, ends of the electrodes 7b or the electrodes 9b connected to the electrodes 7a are brought into the mounting area on which the liquid crystal driving IC 11 is mounted from three sides of the mounting area. From the remaining side of the mounting area, ends of connecting terminals 14 for connection to an external circuit are brought into the mounting area.

FIG. 4(b) is a sectional view showing a state in which bumps 11a of the liquid crystal driving IC 11 and the terminals 14 on the substrate 3b are electrically connected together. As shown in FIG. 4(b), the ACF 12 contains bonding resin 12a which is a thermosetting resin and conductive particles 12b scattered in the bonding resin 12a.

The liquid crystal driving IC 11 is bonded to the substrate 3b by the bonding resin 12a. At this time, the conductive particles 12b contained in the AFC 12 are sandwiched between the bumps 11a and the terminals 14 in order to electrically connect the bumps 11a and the terminals 14 together. Similarly to the terminals 14, the electrodes 7b and 9b are electrically connected to the bumps 11a through the ACF 12.

Hereunder, a description of the mounting operation of the liquid crystal driving IC 11 will be given with reference to FIGS. 3 to 5.

As shown in FIG. 3(a), the ACF 12 is applied to the area of the substrate 3b where the liquid crystal driving IC 11 is to be mounted, and the liquid crystal driving IC 11 is pressed onto the ACF 12 with a predetermined pressure. This causes the liquid crystal driving IC 11 to be temporarily bonded as a result of making use of the viscosity of the ACF 12, as shown in FIG. 3(b).

Then, as shown in FIG. 5, the substrate 3b is transferred by driving a transfer table 52 in order to place an edge (that is, the left edge in FIG. 5) of the substrate 3b onto a receiving table 51 so that the liquid crystal driving IC 11 that has been temporarily press-bonded opposes a thermal press-bonding head 50. As shown in FIG. 5, a heater 51a is incorporated in the interior of the receiving table 51. By placing the substrate 3b on the receiving table 51 for a predetermined period of time, the temperature of the area of the substrate 3b where the liquid crystal driving IC 11 is mounted is increased to a temperature which is 20°~40°, more preferably, 25° C.~35° C. below the glass transition point of the bonding resin serving as a thermosetting resin contained in the ACF 12. It is preferable that this temperature is set so that the thermosetting of the bonding resin contained in the ACF 12 substantially does not start and so that the viscosity of the bonding resin is decreased.

In the embodiment, the temperature of the substrate 3b, or the ACF, is controlled by a heater so as to fall within a range of from 60° C.~90° C.

After the substrate 3b has been raised to the aforementioned temperature, as shown in FIG. 4(a) the thermal press-bonding head 50 heated to a predetermined temperature presses the liquid crystal driving IC 11 at a predetermined pressure in order to cause the ACF 12 to melt and flow. After the ACF 12 has flown, the bonding resin 12a of the ACF 12 sets as a result of being heated in order to bond the liquid crystal driving IC 11 to the substrate 3b. By sandwiching the conductive particles 12b between the bumps 11a of the liquid crystal driving IC 11 and the connecting terminals 14 on the substrate 3b, the liquid crystal driving IC 11 and the terminals 14 are electrically connected together.

In this embodiment, prior to an actual press-bonding operation by the thermal press-bonding head 50, the substrate 3b is heated to a temperature which is 20° C. to 40° C. below the glass transition point of the ACF 12, so that the difference between the temperature of the liquid crystal driving IC 11 and that of the substrate 3b when the liquid crystal driving IC 11 is mounted by carrying out the actual press-bonding operation can be decreased. Therefore, it is possible to reduce residual stress after the mounting of the liquid crystal driving IC 11. In addition, since, prior to the actual press-bonding operation, the substrate 3b is heated by the receiving table 51, causing the temperature of the ACF 12 to increase, the viscosity of the ACF 12 in the actual press-bonding operation is sufficiently decreased, so that the ACF 12 flows quickly. Therefore, the conductive particles 12b tend to remain between the bumps 11a of the liquid crystal driving IC 11 and the terminals 14 on the substrate 3b, making it possible to more reliably electrically connect the bumps 11a and the terminals 14 together.

Hereunder, with reference to FIG. 6, a description of an electronic device including the liquid crystal device shown in FIGS. 1 and 2 will be given, taking a portable telephone as an example of the electronic device.

A portable telephone 100 shown in FIG. 6 comprises an outer case 106 which accommodates various structural elements, such as an antenna 101, a speaker 102, the liquid crystal device 1, key switches 103, and a microphone 104. A control circuit substrate 107 having mounted thereon a control circuit for controlling the operation of each of the aforementioned elements is provided inside the outer case 106.

In the portable telephone 100, signals input through any of the key switches 103 and the microphone 104, reception data received by the antenna 101, etc., are input to the control circuit on the control circuit substrate 107. Based on the various pieces of input data, the control circuit causes images of, for example, numbers, characters, and patterns to be displayed within the display surface of the liquid crystal device 1. In addition, the control circuit also causes data to be sent from the antenna 101.

Although the present invention has been described with reference to a preferred embodiment, the present invention is not limited to this embodiment. Various modifications and changes may be made within the scope of the claims of the present invention. For example, although, in the embodiment, the mounting of a semiconductor chip has been described, the present invention may be applied to the mounting of various other types of components.

In the embodiment, the present invention is applied to a method of producing a passive-matrix translucent liquid crystal display device. It may also be applied not only to a method of producing active matrix liquid crystal devices, but also to a method of producing electro-optical devices such as flat panels including plasma display panels or EL (electroluminescence) panels other than liquid crystal devices. It may further be applied to a method of producing various types of devices other than electro-optical devices. In addition, although the liquid crystal device of the present invention has been described as being utilized in a portable telephone used as an electronic device, the liquid crystal device produced by carrying out the method of mounting a component can be used in any other types of electronic devices such as a portable information terminal, an electronic notebook, or a video camera finder.

What is claimed is:

1. A method of mounting a component in which the component is thermally press-bonded onto a substrate with a conductive adhesive, the method comprising the steps of:

heating the substrate to a mounting temperature which is 20° C.~40° C. below a glass transition point of a bonding resin contained in the conductive adhesive; and thermally press-bonding the component with the conductive adhesive onto the substrate heated to the mounting temperature.

2. The method of mounting a component according to claim 1, wherein in the step of heating the substrate, the substrate is heated to a temperature which is 25° C.~35° C. below the glass transition point of the conductive adhesive.

3. The method of mounting a component according to claim 1, wherein in the step of heating the substrate, the substrate is heated to the mounting temperature by heating a receiving table on which the substrate is placed.

4. The method of mounting a component according to claim 1, wherein the conductive adhesive contains thermosetting resin as the bonding resin and conductive particles mixed in the thermosetting resin.

5. The method of mounting a component according to claim 1, wherein a semiconductor chip used as the component is mounted on a glass substrate used as the substrate.

6. The method of mounting a component according to claim 5, wherein the glass substrate forms a liquid crystal device.

7. The method of mounting a component according to claim 1, wherein the glass transition point of the conductive adhesive lies in a range of from 80° C. to 130° C.

8. A method of mounting a component in which the component is thermally press-bonded onto a substrate with a conductive adhesive, the method comprising the steps of:

temporarily press-bonding the component onto the substrate with the conductive adhesive;

heating the substrate to a mounting temperature which is 20° C.~40° C. below a glass transition point of a bonding resin contained in the conductive adhesive while the component is temporarily press-bonded onto the substrate; and thermally press-bonding the component with the conductive adhesive onto the substrate heated to the mounting temperature.

9. The method of mounting a component according to claim 8, wherein in the step of heating the substrate, the substrate is heated to a temperature which is 25° C.~35° C. below the glass transition point of the conductive adhesive.

10. The method of mounting a component according to claim 8, wherein in the step of heating the substrate, the substrate is heated to the mounting temperature by heating a receiving table on which the substrate is placed.

11. The method of mounting a component according to claim 8, wherein the conductive adhesive contains thermosetting resin as the bonding resin and conductive particles mixed in the thermosetting resin.

12. The method of mounting a component according to claim 8, wherein a semiconductor chip used as the component is mounted on a glass substrate used as the substrate.

13. The method of mounting a component according to claim 12, wherein the glass substrate forms a liquid crystal device.

14. The method of mounting a component according to claim 8, wherein the glass transition point of the conductive adhesive lies in a range of from 80° C. to 130° C.

15. A method of producing an electro-optical device in which an electro-optical material is formed on substrates, the method comprising the steps of:

mounting a semiconductor chip onto the substrates with an anisotropic conductive film;

wherein the step of mounting the semiconductor chip comprises the steps of:

adhering the anisotropic conductive film onto one of the substrates;

heating the one of the substrates to a mounting temperature which is 20° C. to 40° C. below a glass transition point of a bonding resin contained in the anisotropic conductive film; and thermally press-bonding the semiconductor chip with the anisotropic conductive film onto the substrate heated to the mounting temperature.

16. A method comprising:

providing a substrate;

disposing a conductive adhesive on the substrate;

temporarily press-bonding a component onto the conductive adhesive;

thereafter, heating the substrate to a temperature of about 60° C. to about 90° C.; and thermally press-bonding the component to the heated substrate.

17. The method of claim 16 wherein said conductive adhesive further comprises a conductive adhesive having a glass transition point in a temperature range of from about 80° C. to about 130° C.

* * * * *

UNITED STATES PATENT AND TRADEMARK OFFICE
CERTIFICATE OF CORRECTION

PATENT NO.     : 6,767,763 B1
DATED          : July 27, 2004
INVENTOR(S)    : Kenji Uchiyama It is certified that error appears in the above-identified patent and that said Letters Patent is hereby corrected as shown below:

<u>Column 1,</u>
Line 60, before "40°" insert -- to --

<u>Column 6, 7 and 8,</u>
Claims 1, 8 and 15, should read as follows:

1. A method of mounting a component in which the component is thermally press-bonded onto a substrate with a conductive adhesive, the method comprising:
    a step of providing the substrate with the conductive adhesive disposed thereon;
    a step of disposing the component onto the conductive adhesive after the step of providing the substrate;
    a step of heating the substrate to a mounting temperature which is 20°C-40°C below a glass transition point of a bonding resin contained in the conductive adhesive after the step of disposing the component; and
    a step of thermally press-bonding the component with the conductive adhesive onto the substrate heated to the mounting temperature after the step of heating the substrate.

8. A method of mounting a component in which the component is thermally press-bonded onto a substrate with a conductive adhesive, the method comprising:
    a step of temporarily press-bonding the component onto the substrate with the conductive adhesive;
    a step of heating the substrate to a mounting temperature which 20° C-40°C below a glass transition point of a bonding resin contained in the conductive adhesive while the component is temporarily press-bonded onto the substrate after the step of temporarily press-bonding the component; and
    a step of thermally press-bonding the component with the conductive adhesive onto the substrate heated to the mounting temperature after the step of heating the substrate.

15. A method of producing an electro-optical device in which an electro-optical material is formed on substrates, the method comprising the steps of:
    mounting a semiconductor chip onto the substrates with an anisotropic conductive film;
    wherein the step of mounting the semiconductor chip comprises:
        a step of adhering the anisotropic conductive film onto one of the substrates;
        a step of disposing the semiconductor chip onto the conductive adhesive after the step of adhering the anisotropic conductive film;

UNITED STATES PATENT AND TRADEMARK OFFICE
CERTIFICATE OF CORRECTION

PATENT NO. : 6,767,763 B1
DATED : July 27, 2004
INVENTOR(S) : Kenji Uchiyama

It is certified that error appears in the above-identified patent and that said Letters Patent is hereby corrected as shown below:

<u>Column 8, (cont.)</u>
    a step of heating the one of the substrates to a mounting temperature which is 20°C to 40°C below a glass transition point of a bonding resin contained in the anisotropic conductive film after the step of disposing the semiconductor chip; and
    a step of thermally press-bonding the semiconductor chip with the anisotropic conductive film onto the substrate heated to the mounting temperature after the step of heating the one of the substrates.

Signed and Sealed this

Ninth Day of August, 2005

JON W. DUDAS
*Director of the United States Patent and Trademark Office*